June 19, 1962 M. SLAVIN ET AL 3,040,214

PRINTED CIRCUIT CAPACITOR AND METHOD OF MANUFACTURE

Filed April 6, 1959

INVENTORS
MICHAEL SLAVIN
BASIL POWELL HOOTEN JR.

BY Robert T. Killman
ATTORNEY

United States Patent Office 3,040,214 Patented June 19, 1962

3,040,214

PRINTED CIRCUIT CAPACITOR AND METHOD OF MANUFACTURE

Michael Slavin, Baltimore County, and Basil P. Hooten, Jr., Towson, Md., assignors to The Bendix Corporation, Towson, Md., a corporation of Delaware Filed Apr. 6, 1959, Ser. No. 804,168
5 Claims. (Cl. 317—101)

This invention relates to capacitors generally and more particularly to capacitor structures for printed circuit boards and the method of assembling capacitor units in circuit on printed circuit boards.

The use of printed circuits has become widespread in the construction of electronic devices and particularly in those devices where mass production techniques are used to achieve reliable low cost volume production. The term "printed circuit" as used in this specification and claims is used as a generic term to describe any type of preformed wiring boards or the like. In the manufacture of circuits using printed wiring boards the wiring on the board is arranged in the proper configuration with suitable holes for accepting the leads of the components which are to be assembled and connected by the printed wiring. The printed circuit board supports the components to complete the electric assembly. The general practice in such construction is to secure the leads of the components by mechanical means in the apertures in the printed wiring board and after all components are in place to dip-solder the assembled unit such that a solder bond is formed between the lead of the component and the surrounding printed wiring adjacent the aperture through which the lead projects.

It is an object of the present invention to provide an improved component assembly structure in a printed wiring board circuit.

Another object of this invention is to provide an improved method for connecting a capacitance between spaced circuit points on a printed wiring board.

A further object of this invention is to provide an economical capacitor unit which may be rapidly assembled in a printed wiring board without the need for auxiliary restraining means prior to dip-soldering the assembled unit.

A further object of this invention is to provide a simple capacitor unit for printed circuits which the value of capacitance can be selected and economically employed in various parts of the circuit without extensive production design alterations.

These and other objects of the invention will be apparent from the following detailed description taken in conjunction with the accompanying drawings wherein.

In accordance with the invention a flexible sheet such as the laminated structure formed of two conductive plates separated by an insulating lamination is employed. This component is temporarily positioned prior to dip-soldering in a printed circuit board by friction and the resilient force exerted by slightly arching the laminated plate assembly and inserting it into a suitably shaped hole. In this manner the capacitance between the conductive plates of the laminated structure is positioned and subsequently connected to printed wiring leads on the board by forming a solder bond formed between the printed wires and the respective conductive plates.

Figure 1:
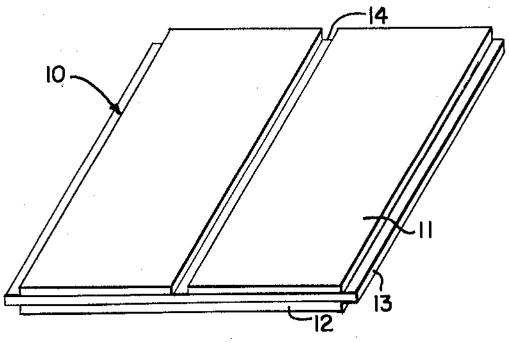
FIG. 1 is a perspective view of a capacitor used in the invention.

Referring now to FIG. 1 a capacitor unit is shown comprising a pair of conducting plates 11, 12 bonded to opposite surfaces of a dielectric sheet 13. The capacitor of FIG. 1 may be any well known laminated material such as electrolytic copper bonded to fish paper, fiber glass or other suitable dielectric sheet which may be extremely thin. The laminated structure of FIG. 1 forms a flexible sheet having some degree of resilience and can be readily cut to any desired shape by simple shears or other cutting procedures. To form a plurality of capacitors having a common electrode 12, the opposed sheet 11 may be subdivided by grooves 14 which may have any desired width to separate the separate portions of the sheet 11 a suitable distance. The dielectric sheet 13 may extend beyond the edges of the plates 11, 12.

Figure 2:
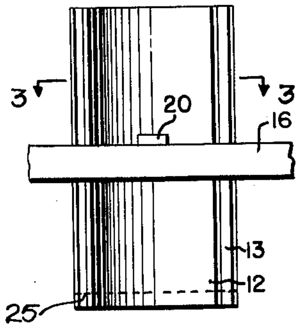
FIG. 2 is an elevational view of a capacitor positioned in a printed circuit board.
Figure 3:
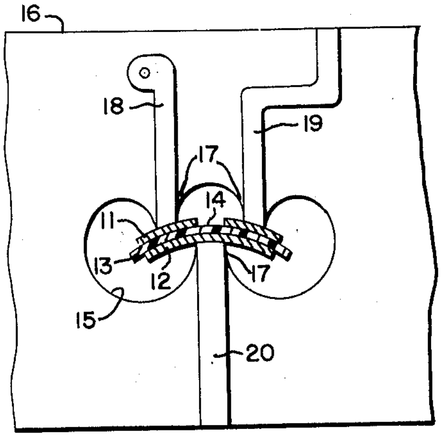
FIG. 3 is a plan view partly in section taken along the lines 3—3 of FIG. 2.

The capacitor of FIG. 1 is assembled in a printed circuit board in accordance with the invention as shown in FIGS. 2 and 3, wherein the laminated plate has been bent to form a slight arch and inserted through a suitable aperture 15 in a dielectric support board 16. The aperture 15 may have a number of opposed reentrant portions 17 which may be interdigitated to provide an arcuate path between the free faces of the portions 17. With this structure the capacitor 10 can be inserted transversely to the board 16 through the aperture 15 and the resilience of the laminated sheet 10 will retain the unit by friction against the opposed free surfaces of the portions 17.

In order to utilize the structure shown in FIGS. 2 and 3 as a capacitor the appropriate printed wires on the board 16 such as wires 18, 19, 20 are secured to the board 16 in a conventional manner and positioned to extend along the board on the reentrant portions 17. With this construction the leads 18, 19, 20 each abut a respective portion of the conductive sheets 11, 12 which are temporarily secured in position to be bonded thereto by the dip-soldering operation, as will be described hereinafter. In the dip-soldering operation the projection of dielectric 13 beyond the edges of plates 11, 12 prevents a solder bond across the edges of plates 11, 12. An alternative procedure is indicated by the dotted line 25 in FIG. 2 representing a coating, a solder inhibitor in which the edges of the capacitor may be dipped such as up to the level of line 25. Solder inhibitors are well known in the art to prevent solder from wetting and adhering to areas of conductors coated therewith. Accordingly, the solder will not bond to the plates 11, 12 where coated with solder inhibitor and will not bridge across the plates. Upon completion of the bonding of the leads and conductive sheets, the lead 20 will be connected in circuit and capacitively coupled to lead 18 and separately capacitively coupled to lead 19 with the value of the coupling capacitor determined by the area of the respective portions of sheet 11 coupled to leads 18 and 19 and the area opposed thereto of sheet 12 as well as the thickness of the dielectric 13 and the dielectric constant thereof.

Figure 4:
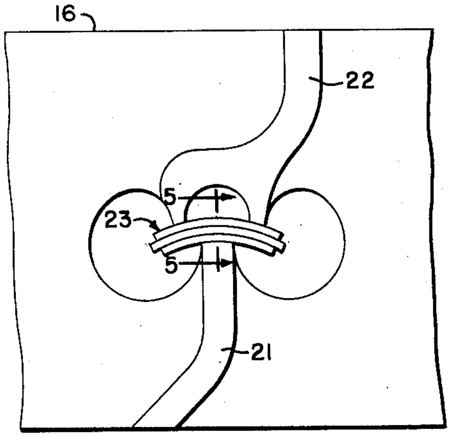
FIG. 4 is a plan view of a modification.

FIG. 4 shows a capacitor in accordance with the invention in a printed circuit board 16 in which leads 21 and 22 are capacitively coupled by a single valued capacitor 23. Lead 22 is bifurcated to provide suitable reentrant portions for temporarily positioning the capacitor 23 in a manner similar to that described with respect to FIG. 3.

Figure 5:
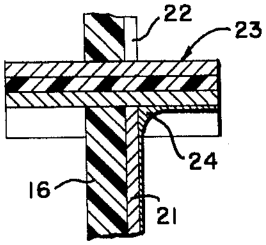
FIG. 5 is a sectional view taken along the line 5—5 of FIG. 4.

The bonding of capacitor 23 to the leads 21, 22 is accomplished by conventional dip-soldering techniques in which the remaining components on the printed circuit board 16 are soldered to the printed wiring in conventional fashion. This procedure results, as shown in FIG. 5, in the permanent bonding of lead 21 to capacitor 23 with a fillet of solder 24.

Figure 6:
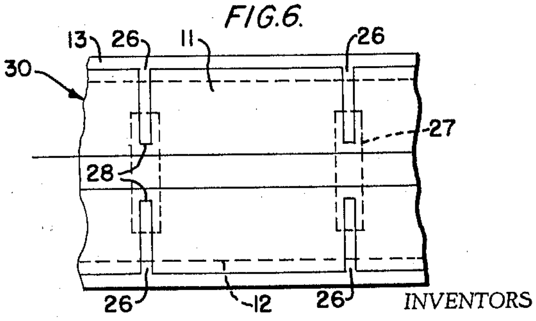
FIG. 6 shows a modified form of capacitor in plan view.

FIG. 6 shows a form of plate capacitor which is adapted for use in accordance with the invention. Individual capacitors are assembled in strip form 30 suitable for dispensing from a roll or other storage arrangement. For this purpose the dielectric strip 13 has copper plates 11, 12 adhering thereto. Plate 11 is partially separated at intervals by opposed notches 26, while plate 12 has central apertures 27 extending past the opposed bottoms 28 of notches 26. With this arrangement the strip 30 can be severed along the center line of the notches 26 to produce individual capacitors with the dielectric 13 protruding beyond the plates 11, 12 at all four edges. Plural capacitors of the type shown in FIG. 3 can be formed by providing a longitudinal separation 14' in the plate 11.

While a particular form of aperture 15 has been shown to provide a temporary restraining force to mount the capacitor plate in position prior to soldering the components of the printed circuit board, it is to be understood that various other shapes of aperture and printed lead configuration could be employed temporarily to mount the capacitor plate and retain the component in position. Accordingly, the disclosure is to be considered as illustrative only and the invention is not limited to the specific disclosed embodiment. Various equivalents will occur to those skilled in the art and the invention is to be considered as limited only by the scope of the appended claims.

What is claimed is:

1. A printed circuit comprising a thin dielectric plate having a hole therein, said hole having off-set opposed reentrant portions to provide a transverse spacing for an arcuate path in the plane of said plate which is wider than the transverse spacing across a linear path in said plane, a pair of conductors on said portions terminating at said hole, a resilient laminated capacitor having outer conductive plates separated by a dielectric sheet, said capacitor being arched to fit in said arcuate path and resiliently urged against said reentrant portions for supporting said capacitor transverse to said dielectric plate with said conductive plates adjacent said conductors respectively and a conductive bond between said adjacent conductors and conductive plates.

2. A printed circuit assembly suitable for dip-soldering comprising a thin dielectric plate having a hole therein, said hole having a pair of spaced projections of said plate depending within the void of the hole and a reentrant projection of said plate extending from a position medially opposite said spaced projections, conductors on said projections extending to the edge of said hole, a resilient laminated capacitor having conductive outer plates separated by a dielectric sheet, said capacitor being bowed and supported in said hole transverse to said dielectric plate by resiliently urged contact of said conductive plates against said projections, and means for inhibiting a solder bond between said conductive plates across the edge of said capacitor.

3. A printed circuit assembly comprising a dielectric plate having an aperture provided with bifurcated cusps and a third cusp extending into the bight of said bifurcated cusps to define an arcuate passageway, conductors on said plate extending to the edges of said cusps, and a resilient circuit element flexed and inserted in said arcuate passageway so as to extend perpendicularly to the plane of said plate and to maintain resilient contact with said cusps and the conductors thereon.

4. A printed circuit assembly comprising a dielectric plate having an aperture provided with bifurcated cusps and a third cusp extending into the bight of said bifurcated cusps to define an arcuate passageway, conductors on said plate extending to the edges of said cusps, and a capacitor formed of a thin dielectric sheet having flexible conductive plates laminated to opposite sides thereof, said capacitor being flexed and inserted in said arcuate passageway so as to extend perpendicularly to the plane of said dielectric plate and to maintain resilient contact with said cusps and the conductors thereon.

5. A printed circuit assembly comprising a dielectric plate having an aperture provided with bifurcated cusps and a third cusp extending into the bight of said bifurcated cusps to define an arcuate passageway, individual conductors on said plate extending to the edges of said cusps, and a capacitor formed of a thin dielectric sheet having a first flexible conductive plate laminated to one side thereof and a pair of separated flexible conductive plates laminated to the opposite side, said capacitor being flexed and inserted in said arcuate passageway so as to extend perpendicularly to the plane of said dielectric plate and with one each of said separated conductive plates resiliently contacting one each of said bifurcated cusps and the conductors thereon and with said first conductive plate resiliently contacting said third cusp and the conductor thereon.

References Cited in the file of this patent

UNITED STATES PATENTS

| | | |
|---|---|---|
| 2,785,350 | Toppari | Mar. 12, 1957 |
| 2,793,333 | Ehlers | May 21, 1957 |
| 2,869,041 | De Cola | Jan. 13, 1959 |
| 2,876,402 | Billings | Mar. 3, 1959 |
| 2,892,130 | Kilby | June 23, 1959 |